(12) United States Patent
Field et al.

(10) Patent No.: US 12,127,373 B2
(45) Date of Patent: Oct. 22, 2024

(54) LIQUID COOLING WITH SHARED EXCHANGER FOR AN INFORMATION HANDLING SYSTEM

(71) Applicant: Dell Products L.P., Round Rock, TX (US)

(72) Inventors: Daniel A. Field, Northboro, MA (US); Yuxin Chen, Shanghai (CN); MingMing Zhang, Shanghai (CN)

(73) Assignee: Dell Products L.P, Round Rock, TX (US)

( * ) Notice: Subject to any disclaimer, the term of this patent is extended or adjusted under 35 U.S.C. 154(b) by 477 days.

(21) Appl. No.: 17/457,170

(22) Filed: Dec. 1, 2021

(65) Prior Publication Data
US 2023/0171921 A1 Jun. 1, 2023

(51) Int. Cl.
*H05K 7/20* (2006.01)

(52) U.S. Cl.
CPC ..... *H05K 7/20272* (2013.01); *H05K 7/20281* (2013.01)

(58) Field of Classification Search
CPC ........... H05K 7/20272; H05K 7/20281; H05K 7/20254; H05K 7/20927; G06F 2200/201; G06F 1/20; F28F 2250/08; F28F 2265/16
See application file for complete search history.

(56) References Cited

U.S. PATENT DOCUMENTS

| | | | |
|---|---|---|---|
| 2016/0128238 A1* | 5/2016 | Shedd | F25B 41/42 361/679.47 |
| 2020/0340767 A1* | 10/2020 | Holden | G01M 3/16 |
| 2021/0378137 A1* | 12/2021 | Chehade | H05K 7/20909 |

* cited by examiner

*Primary Examiner* — Phuong H Nguyen
(74) *Attorney, Agent, or Firm* — Norton Rose Fulbright US LLP

(57) ABSTRACT

Cooling of an information handling system can be provided liquid-assisted cooling apparatus with liquid. The liquid-assisted cooling apparatus may comprise a drip tray component positioned under a liquid-assisted cooling module having a cooling block, a heat exchanger, and piping connecting the cooling block and heat exchanger. The drip tray can collect fluid leaked by or from the liquid-assisted cooling module. The drip tray may include an absorbent material to contain the leaked fluid and/or a liquid sensor to detect the presence of fluid in the drip tray. The liquid sensor may be coupled to a controller configured to adjust operation of one or more electronic components cooled by the liquid-assisted cooling apparatus when fluid is determined to be present in the drip tray.

16 Claims, 5 Drawing Sheets

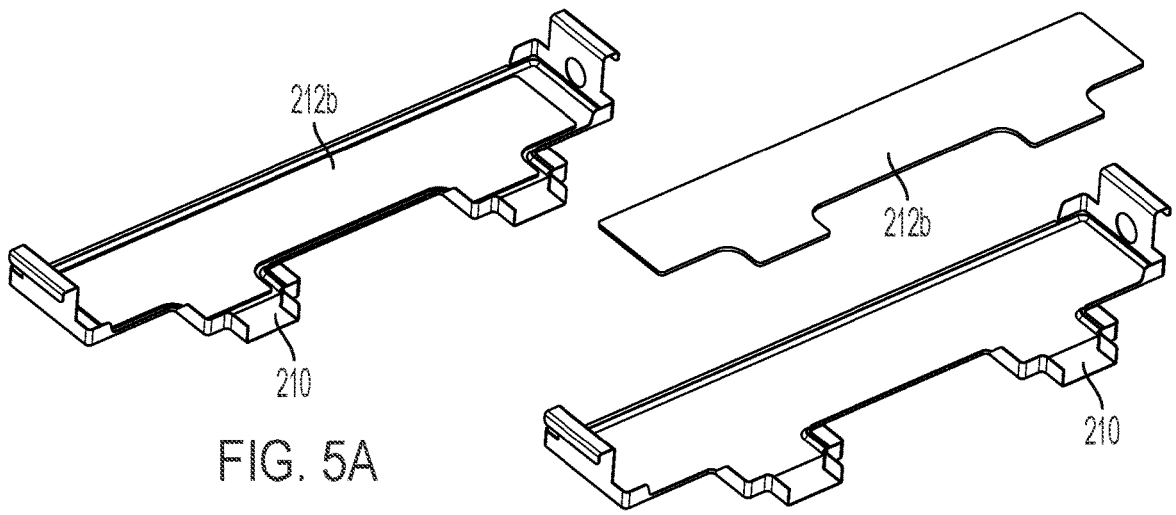
FIG. 5A
FIG. 5B
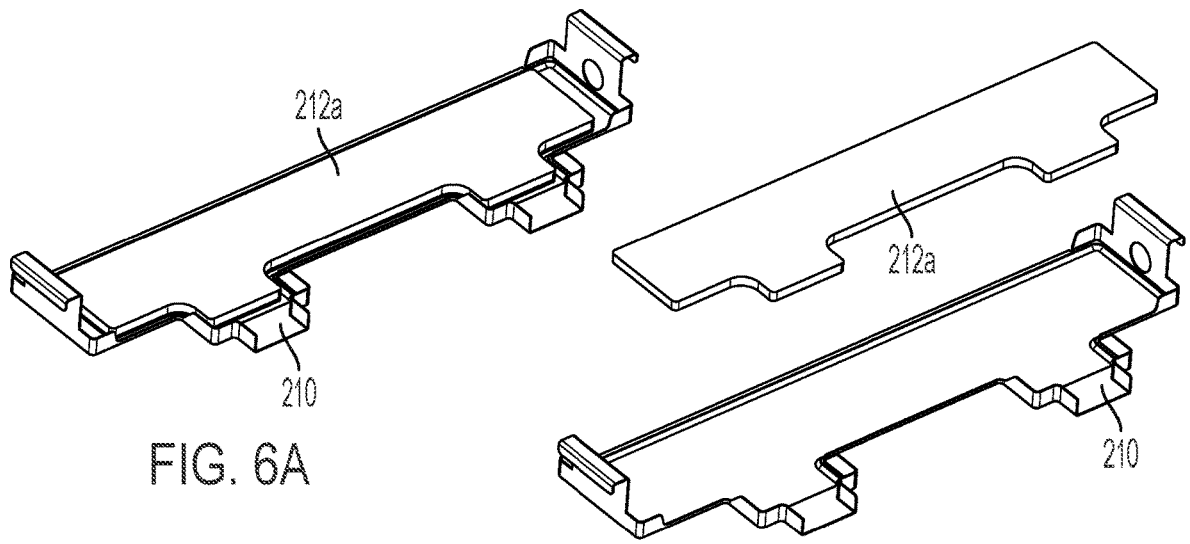
FIG. 6A
FIG. 6B

LIQUID COOLING WITH SHARED EXCHANGER FOR AN INFORMATION HANDLING SYSTEM

FIELD OF THE DISCLOSURE

The instant disclosure relates to information handling systems. More specifically, portions of this disclosure relate to a drip tray positioned under a cooling system of an IHS to collect and contain fluid leakage from the system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems (IHSs) are challenged every generation to increase processing power compared to generations prior. However, increases in processing power are accompanied by increases in heat generation by the processors. Higher temperatures can stress or exceed the capacity of air cooling systems designed to dissipate this heat, significantly reducing the life span of electrical components like processors or causing permanent damage to components.

SUMMARY

Liquid-assisted cooling techniques may be used for the thermal management of electronic components. Liquid-assisted cooling can optimize energy efficiency and space requirements within the IHS, but disadvantages of such cooling systems include the potential for fluid leak. Use of a liquid cooling system in an IHS may be facilitated by a drip tray positioned under components of the cooling system that are prone to fluid leakage. The drip tray may collect and, in some embodiments, contain the fluid leaked from the system. The drip tray may include an absorbent material (e.g., a compressed plant fiber and/or a super-absorbent polymer) to improve collection and containment of fluid leaked from the system, and the absorbent material may be configured to absorb a volume of fluid at least as large as the volume of fluid contained within the cooling system. The drip tray may further include a liquid sensor configured for detecting the presence of liquid in the drip tray. With the drip tray configured to detect, collect, and/or contain fluid leakage from the system, a method of cooling an IHS may include pumping liquid through one or more cooling blocks to a heat exchanger shared by the one or more cooling blocks, determining the presence of fluid in the drip tray positioned under at least portions of the one or more cooling blocks and the heat exchanger, and adjusting operation of at least one electronic component thermally coupled to the one or more cooling blocks to reduce heat generation based on determining the presence of fluid in the drip tray.

A liquid-assisted cooling system comprising a drip tray, such as described in embodiments herein, may protect against fluid leakages in an IHS, thus allowing for more efficient liquid-assisted cooling systems to be used within the IHS. For example, when fans used for air cooling an IHS are inadequate to dissipate heat produced by the electronic components of the IHS, a liquid-assisted cooling system be used to further enhance cooling to improve electronic device operation. Water or another fluid may be used in such liquid-assisted cooling systems for heat exchange with the electronic components. However, use of liquid coolant increases the complexity of the cooling system and the potential for a fluid leak. Leaked fluid can damage, corrode, or short-circuit sensitive electronic components with which it comes into contact, and the need to test for and repair leaks makes for more complex and less reliable installations of cooling systems. Shortcomings mentioned here are only representative and are included to highlight problems that the inventors have identified with respect to existing information handling systems and sought to improve upon. Aspects of the information handling systems described below may address some or all of the shortcomings as well as others known in the art. Aspects of the improved information handling systems described below may present other benefits than, and be used in other applications than, those described above.

According to one embodiment, an apparatus may include a first cooling block for a first electronic component comprising a first fluid cavity, a heat exchanger comprising piping, the piping coupled to the first fluid cavity of the first cooling block, and a drip tray positioned under the heat exchanger and extending at least to the edges of the piping.

In certain embodiments, the first cooling block comprises a first fluid pump coupled to the first fluid cavity. In certain embodiments, the piping of the heat exchanger is coupled to the first cooling block through a piping connector, and wherein the drip tray comprises at least one protrusion extending beyond the heat exchanger and under the piping connector.

In certain embodiments, the apparatus further comprises an absorbent material in the drip tray. The absorbent material, in certain embodiments, comprises compressed plant fiber. In certain embodiments, the absorbent material comprises super absorbent polymer (SAP). In certain embodiments, the absorbent material is configured to absorb a volume of fluid at least as large as the length of piping of the heat exchanger, and in some embodiments, the drip tray comprises a depth at least as large as a thickness of the absorbent material after absorbing the volume of fluid.

In certain embodiments, the apparatus further comprises the first electronic component, and in some embodiments, the first cooling block is thermally coupled to the first electronic component. In certain embodiments, the apparatus further comprises a second electronic component and a second cooling block comprising a second fluid cavity. In some embodiments, the second cooling block is thermally coupled to the second electronic component. In some embodiments, the piping of the heat exchanger is coupled to the second fluid cavity of the second cooling block.

In certain embodiments, the apparatus further comprises a fluid sensor in the drip tray and a controller coupled to the fluid sensor. In certain embodiments, the controller is configured to perform steps comprising: determining a failure of the first electronic component; determining a presence of fluid in the drip tray based on the fluid sensor; and adjusting operation of the second electronic component based on the failure of the first electronic component and the presence of fluid.

In certain embodiments, the apparatus further comprises a second fluid pump coupled to the second fluid cavity and a controller. In certain embodiments, the controller is configured to perform steps comprising: determining a failure of the first fluid pump; and adjusting operation of the first electronic component and the second electronic component corresponding to fluid flow of the second fluid pump based on the failure of the first fluid pump to reduce heat generation.

According to another embodiment, an information handling system may comprise a memory, a first processor coupled to the memory, a second processor coupled to the memory, a first cooling block thermally coupled to the first processor comprising a first fluid cavity, a second cooling block thermally coupled to the second processor comprising a second fluid cavity, a heat exchanger comprising piping, and a drip tray. In certain embodiments, the piping coupled to the first fluid cavity of the first cooling block and the second fluid cavity of the second cooling block. In certain embodiments, the drip tray is positioned under the heat exchanger and extending at least to the edges of the piping.

In certain embodiments, the information handling system further comprises a fluid sensor in the drip tray and a controller. In certain embodiments, the controller is coupled to the first processor and to the second processor. In certain embodiments, the controller is configured to perform steps comprising: determining a failure of the first processor; determining a presence of fluid in the drip tray based on the fluid sensor; and adjusting operation of the second processor based on the failure of the first electronic component and the presence of fluid.

In certain embodiments, the information handling system further comprises a controller coupled to the first processor and to the second processor. In certain embodiments, the controller is configured to perform steps comprising: determining a failure of the first fluid pump; and adjusting operation of the first electronic component and the second electronic component based on the failure of the first fluid pump corresponding to fluid flow of the second fluid pump to reduce heat generation.

In certain embodiments, the first cooling block comprises a first fluid pump coupled to the first fluid cavity. In certain embodiments, the piping of the heat exchanger is coupled to the first cooling block through a piping connector. In certain embodiments, the drip tray comprises at least one protrusion extending beyond the heat exchanger and under the piping connector. In certain embodiments, the information handling system further comprises an absorbent material in the drip tray. In certain embodiments, the absorbent material comprises compressed plant fiber or a SAP.

According to another embodiment, a method comprises: pumping fluid through a first cooling block and a shared heat exchanger with a first pump; pumping fluid through a second cooling block and the shared heat exchanger with a second pump; determining a failure in the liquid-assisted cooling system; and adjusting operation of at least one of a first electronic component thermally coupled to the first cooling block or a second electronic component thermally coupled to the second cooling block based on determining the presence of fluid in the drip tray.

In certain embodiments, determining a failure in the liquid-assisted cooling system comprises determining a presence of fluid in a drip tray under the shared heat exchanger. In certain embodiments, the method further comprises: adjusting operation of the second electronic component based on the failure of the first electronic component and the presence of fluid.

In certain embodiments, determining a failure in the liquid-assisted cooling system comprises determining a failure of the first fluid pump. In certain embodiments, the method further comprises: adjusting operation of the first electronic component and the second electronic component corresponding to fluid flow of the second fluid pump based on the failure of the first fluid pump.

As used herein, the term "coupled" means connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially parallel includes parallel), as understood by a person of ordinary skill in the art.

The phrase "and/or" means "and" or "or". To illustrate, A, B, and/or C includes: A alone, B alone, C alone, a combination of A and B, a combination of A and C, a combination of B and C, or a combination of A, B, and C. In other words, "and/or" operates as an inclusive or.

Further, a device or system that is configured in a certain way is configured in at least that way, but it can also be configured in other ways than those specifically described.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements, but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 5A is a top profile view of a drip tray of a liquid-assisted cooling apparatus comprising an absorbent material in a first unexpanded state according to embodiments of the disclosure.

FIG. 5B is a top profile exploded view of the drip tray and absorbent material of FIG. 5A according to embodiments of the disclosure.

FIG. 6A is a top profile view of a drip tray of a liquid-assisted cooling apparatus comprising an absorbent material in a second expanded state according to embodiments of the disclosure.

FIG. 6B is a top profile exploded view of the drip tray and absorbent material of FIG. 6A according to embodiments of the disclosure.

DETAILED DESCRIPTION

Figure 1:
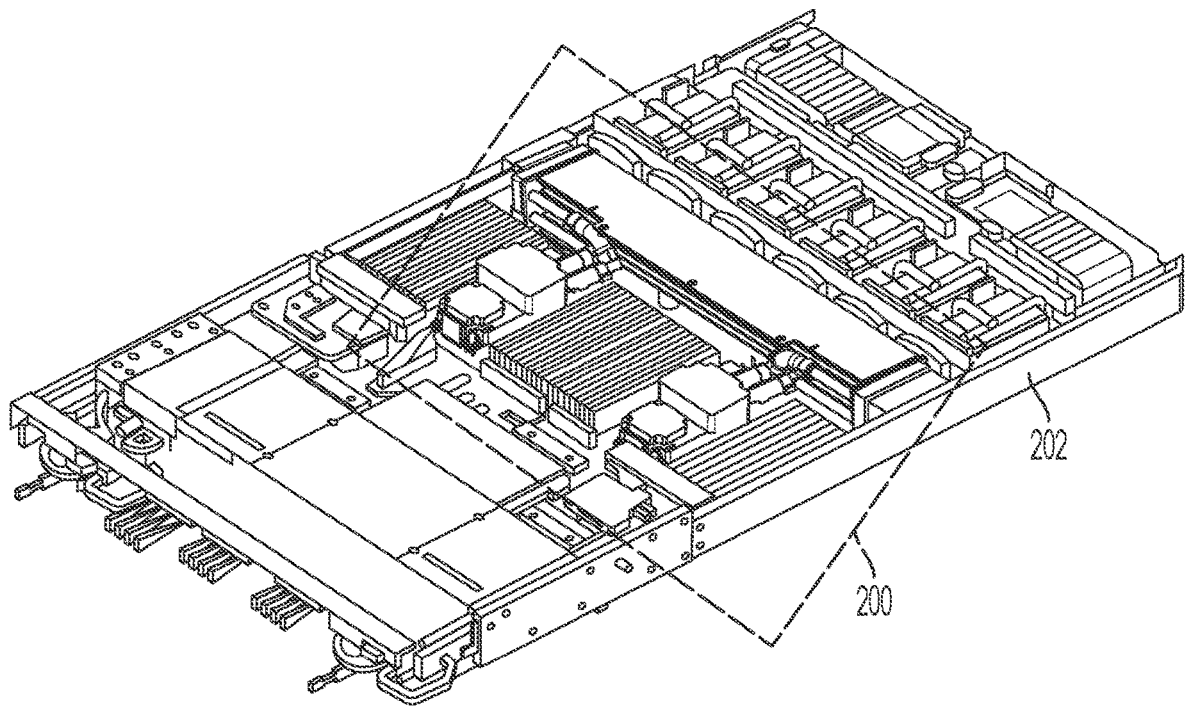
FIG. 1 is a schematic of a top profile view of an example of a surface having a liquid-assisted cooling apparatus according to embodiments of the disclosure.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The functions performed by the above-described electronic components of the IHS generate heat within the IHS, and IHS cooling is used to remove the heat to maintain the components operating within permissible operating temperature limits. Cooling may be designed to reduce the ambient temperature within the electronic component, such as by exhausting hot air, or to cool a single component or small area. Components commonly cooled individually include central processing units and graphics processing units but can apply to other devices. Cooling is accomplished by movement of heat from the component top surface into the liquid of the cooling loop. Alternatively or additionally, to increase the efficiency of heat transfer, active cooling may be accomplished using a liquid-assisted cooling apparatus. A liquid-assisted cooling apparatus may comprise a liquid-assisted cooling module including a cooling block, a fluid-to-air heat exchanger, and piping. By transferring heat from electronic components to a separate heat exchanger, which can be made large and use larger, lower-speed fans, liquid-assisted cooling can allow quieter operation, improved processor speeds, or a balance of both compared to traditional air cooling systems. As used herein a "liquid-assisted cooling" system may include systems that transfer heat from an electronic component through a heat conduction channel at least partially through a liquid medium. For example, a liquid-assisted cooling system may transfer heat from the electronic component in water to a radiator, in which the heat is then dissipated through air. In some embodiments, aspects of the described system may be used in cooling systems that transfer heat by water to another dissipation source, such as a large body of water.

The liquid-assisted cooling apparatus may include a drip tray component positioned under the liquid-assisted cooling module. In some embodiments, the drip tray component may collect fluid that escapes from components of the liquid-assisted cooling module that may be prone to leak. In some embodiments, the drip tray component may include an absorbent material. This absorbent material can transition between an unexpanded state in which the material is capable of absorbing fluid leaked from the liquid-assisted cooling module and an expanded state in which the material has absorbed fluid leaked from the liquid-assisted cooling module. The drip tray may also comprise a liquid sensor coupled to a controller configured to adjust operation of one or more electronic components cooled by the liquid-assisted cooling apparatus when fluid is determined to be present in the drip tray based on information received from the liquid sensor. In these embodiments, the liquid-assisted cooling module may cool one or more electronic components of an IHS with a reduced risk of fluid flow between the one or more electronic components and/or overheating of the one or more electronic components, which can prevent damage to the electronic components and/or data loss, for example.

One example embodiment of such a liquid-assisted cooling (LAC) apparatus is shown in FIG. 1. FIG. 1 is a top profile view of a LAC apparatus 200 mounted to a surface 202 in an IHS, such as a circuit board or chassis thereof, according to embodiments of the disclosure. Surface 202 may have, e.g., a bracket for mounting of LAC apparatus 200. Surface 202 may be made of, e.g., sheet metal or plastic.

Figure 2:
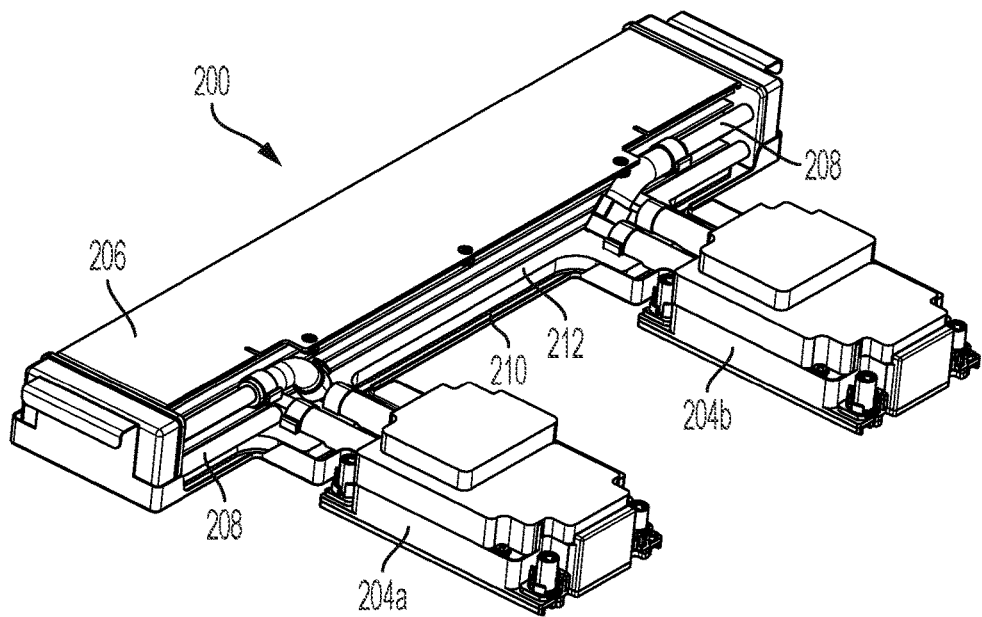
FIG. 2 is top profile view of a liquid-assisted cooling apparatus having a drip tray and a liquid-assisted cooling module according to embodiments of the disclosure.

Embodiments of LAC apparatus 200 of FIG. 1 are shown in more detail in FIGS. 2-6. FIG. 2 is a top profile view of LAC apparatus 200 according to embodiments of the disclosure. LAC apparatus 200 may comprise a LAC module comprising at least one cooling block 204, a fluid-to-air heat exchanger 206, and piping 208. The LAC module may further comprise a reservoir to store excess fluid to be supplied to cooling block 204. Fluid may be a coolant and may include one or more of, but is not limited to, water (e.g., deionized water, distilled water), ethylene glycol/water, propylene glycol/water, or dielectric fluid (e.g., polyalphaolefin or fluorocarbons).

Cooling block(s) 204 may include at least a base and a top. The base may comprise the area in contact with the electronic component being cooled and is usually manufactured from metals with high thermal conductivity (e.g., aluminum, copper, nickel, nickel-plated brass). The top may comprise connections for piping from heat exchanger 206 and can be made of, e.g., metals with high thermal conductivity (e.g., aluminum, copper, nickel, nickel-plated brass), poly (methyl methacrylate), polyoxymethylene, nylon, or high-density poly ethylene. The base and top may be sealed together to form a block having a fluid cavity therein for flow of fluid. In some embodiments, cooling block(s) 204 comprise a fluid pump coupled to the fluid cavity. The pump may be an electrical motor that rotates an impeller, which creates pressure to move fluid within the LAC system between cooling block(s) 204 and heat exchanger 206 and/or between cooling block(s) 204.

In some embodiments, one or more electronic components to be cooled are thermally coupled to the at least one cooling block 204 of LAC apparatus 200. For example, 1, 2, 3, 4, 5, 6, 7, 8, or more electronic components are to be cooled and may be coupled to 1, 2, 3, 4, 5, 6, 7, 8, or more cooling blocks 204. In the embodiment shown in FIGS. 1-6, LAC apparatus 200 comprises two cooling blocks 204a and 204b, either or both of which may be thermally coupled to an electronic component to be cooled. Electronic components include but are not limited to, e.g., central processing units (CPU), graphics processing units (GPU), system-on-chips (SoCs) comprising one or more of a CPU, GPU, and other components, and/or application-specific integrated circuits (ASICs). In some embodiments, the electronic components may share other components, such as when two or more CPUs share a single memory or non-volatile memory. The sharing of exchanger 206 by two or more electronic components coupled to two or more cooling blocks 204, respectively, may reduce space occupied in an information handling system by the liquid-assisted cooling system. However, the sharing may also result in one failure affecting several or all of the electronic components sharing the exchanger 206. For example, a leak in one of the cooling blocks 204 may cause liquid to drain from the exchanger 206, resulting in reduced cooling capacity in the other cooling blocks that normally circulate liquid from the exchanger 206. As another example, a pump failure in one of the cooling blocks 204 may reduce fluid flow from the exchanger 206 to other cooling blocks, resulting in reduced cooling capacity in the other cooling blocks.

Fluid-to-air heat exchanger 206 may be any type of heat exchanger, including but not limited to a shell and tube heat exchanger, a plate heat exchanger, a plate and shell heat exchanger, an adiabatic wheel heat exchanger, a plate fin heat exchanger, a finned tube heat exchanger, a pillow plate heat exchanger, a waste heat recovery unit, a dynamic scraped surface heat exchanger, a phase-change heat exchanger, a direct contact heat exchanger, or a microchannel heat exchanger. In some embodiments, heat exchanger 206 is a radiator, and the radiator comprises thin, slightly separated plates having large surface areas and small fluid flow passages for heat transfer. Fans may be mounted on one or both sides of heat exchanger 206 or remotely in the system to generate airflow to assist with transporting heat away from the electronic components. For example, heat exchanger 206 may have 1, 2, 3, 4, or more fans mounted on one or both sides. In some embodiments, heat exchanger 206 is shared by all cooling blocks of LAC apparatus 200. For example, in the embodiment shown in FIGS. 1-6, heat exchanger 206 is shared by two cooling blocks 204a and 204b. In some embodiments, fluid-to-air exchanger 206 may be replaced by augmented by an exchanger to another medium, such as an exchange with another liquid cooling system.

Figure 3:
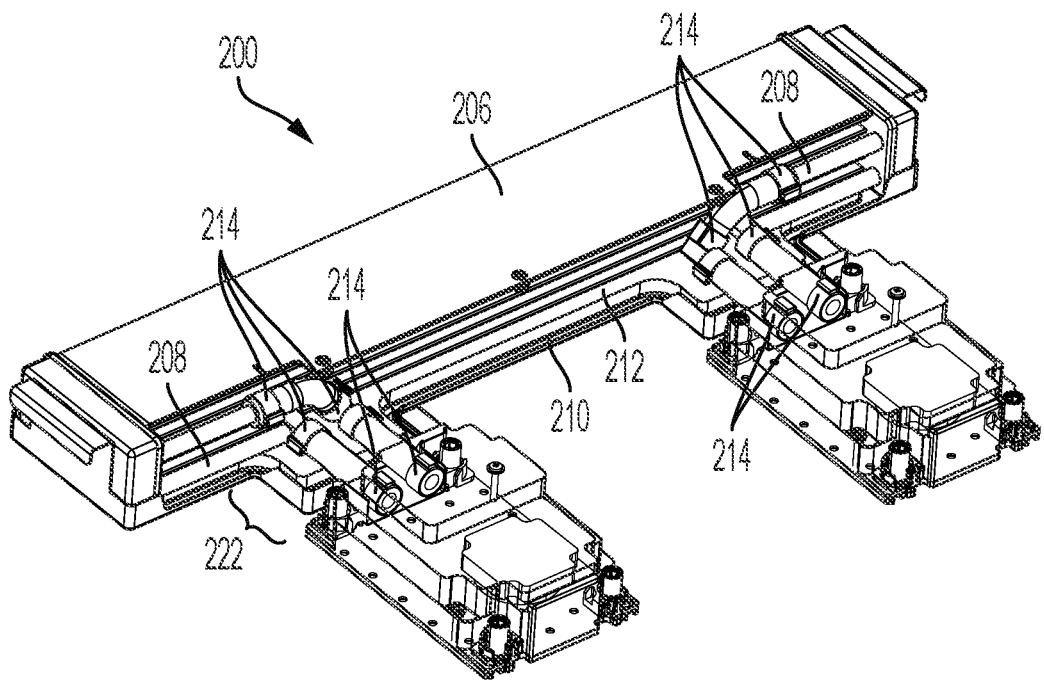
FIG. 3 is a top profile view of a liquid-assisted cooling apparatus illustrating a configuration of a drip tray and liquid-assisted cooling module components of the apparatus according to embodiments of the disclosure.

Piping 208 may be rigid or flexible and may connect cooling block 204 and fluid-to-air heat exchanger 206 such that the fluid cavity of cooling block(s) 204 and fluid-to-air heat exchanger 206 are in fluid communication with one another in a closed loop. Piping 208 can be made of, e.g., polyethylene terephthalate glycol, acrylic, glass, carbon, metal, plastic, neoprene, rubber, silicone, PVC, etc. As shown in FIG. 3, fittings or connectors 214 may connect piping 208 at joints where piping 208 interfaces with additional piping; fittings or connectors 214 may also connect piping 208 where it interfaces with cooling block(s) 204. Fittings or connectors 214 may be of any type to couple piping 208 to additional piping and/or at cooling block(s) 204, including barbed connectors, push-in connectors, quick disconnect connectors, compression connectors, angled adapters (e.g., 90°, 45° and the 2×45° adapters), rotary adapters, fixed adapters, rotary extenders, and/or static extenders. Fittings or connectors 214 may have any combination of male and/or female inlets and/or outlets. For example, fittings or connectors 214 may have a female inlet or outlet, a male inlet or outlet, a female inlet and outlet, a male inlet and outlet, a female inlet and male outlet, or a male inlet and female outlet.

Figure 4:
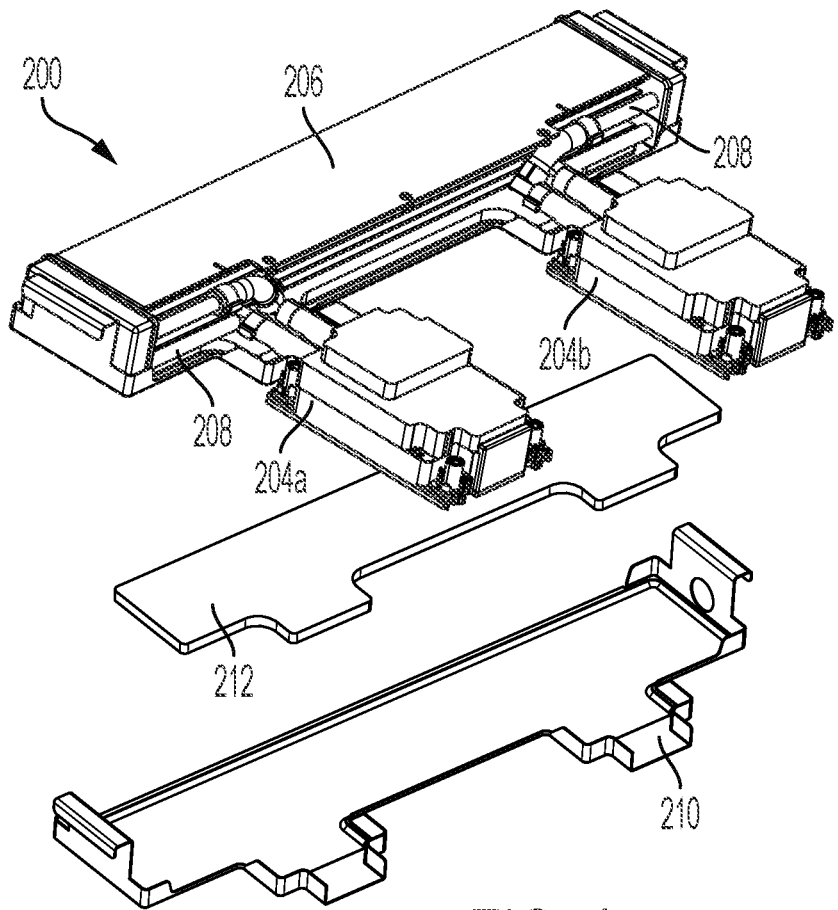
FIG. 4 is a top profile exploded view of the liquid-assisted cooling apparatus of FIGS. 3 and 4 and illustrates an arrangement of a drip tray, an absorbent material, and liquid-assisted cooling module components according to embodiments of the disclosure.

As shown in FIG. 2 and as illustrated in more detail in FIGS. 4-6, LAC apparatus 200 may further comprise a drip tray 210. Drip tray 210 may be made of the same material as surface 202 to which LAC apparatus 200 mounts (e.g., sheet metal or plastic). Drip tray 210 may be positioned under heat exchanger 206 and may extend at least to the edges of piping 208 where piping 208 interfaces with cooling block(s) 204. In some embodiments, the body of drip tray 210 defines one or more protrusions that extend at least to the edges of piping 208 where piping 208 interfaces with cooling block(s) 204. For example, drip tray 210 may include one or more protrusions 222 that extend to under fittings or connectors 214 that connect piping 208 where it interfaces with cooling block(s) 204. The protrusions may correspond to each of the connected cooling block(s) 204 and/or correspond to each electronic component cooled using water in the heat exchanger 206. The drip tray 210 may be configured to capture or otherwise contain liquid leaking from an aspect of the LAC apparatus 200. Containing the liquid may reduce or prevent short circuits and/or contamination of equipment or personnel.

Drip tray 210 may comprise an absorbent material 212. Absorbent material 212 may be disposed between drip tray 210 and the LAC module and may be configured to collect and contain fluid leaked from the LAC module. Absorbent material 212 may comprise super-absorbent polymers (SAPs), compressed plant fibers or other absorbent material.

"Compressed plant fibers" refers to a water-swellable, hydrophilic organic material capable, under the most favorable conditions, of absorbing 5 and 50 times its weight, for example, at least about 5 times its weight in an aqueous solution, at least about 15 times its weight in an aqueous solution, at least about 30 times its weight in an aqueous solution, or at least about 50 times its weight in an aqueous solution.

The compressed plant fibers may be natural, synthetic, and modified natural fibers and materials. In some embodiments, the compressed plant fibers can also have a surface modification, such as a partial or full surface coating, for example to increase the hydrophilicity of the compressed plant fibers. Exemplary compressed plant fibers suitable for use in drip tray 210 can comprise any known cellulosic, hemi-cellulosic, and/or lignocellulosic fibers, for example such as seed fiber (e.g., cotton, kapok, jute), bast fiber (e.g, flax, hemp, ramie, kenaf), leaf fiber (e.g., abaca, sisal, henequen), grass fiber (e.g., ryegrass, timothy, cocksfoot, fescues, bromes, alfa, sea grass), legume fibers (e.g., white clover, red clover, lucerne), bamboo, corn husk or stalk, hop stem, pineapple leaf, coir, bagasse, banana, wheat straw, rice straw, sorghum stalk, barley straw, regenerated cellulose, viscose, modal, lyocell, cupro, rubber, or alginate.

"Superabsorbent" or "superabsorbent material" or "SAP" refers to a water-swellable, water-insoluble organic or inorganic material capable, under the most favorable conditions, of absorbing 15 and 50 times its weight, for example, at least about 15 times its weight in an aqueous solution, at least about 30 times its weight in an aqueous solution, or at least about 50 times its weight in an aqueous solution.

Superabsorbent polymer material suitable for use in drip tray 210 can comprise any superabsorbent polymer particles known from superabsorbent literature. For example, the SAP particles may be spherical, spherical-like or irregularly shaped particles, such as sausage shaped particles, or ellipsoid shaped particles of the kind typically obtained from inverse phase suspension polymerizations. The SAP particles can also be optionally agglomerated at least to some extent to form larger irregular particles. In some embodiments, the SAP particles can also have a surface modification, such as a partial or full surface coating, for example to increase the hydrophilicity of the SAP particles.

The SAP materials can be natural, synthetic, and modified natural polymers and materials. In addition, the SAP materials can be or include organic compounds such as cross linked polymers. "Cross-linked" is a commonly understood term and refers to any approach for effectively rendering normally water-soluble materials substantially water insoluble, but swellable. Such polymers can include, for example, carboxymethylcellulose, alkali metal salts of polyacrylic acids, polyacrylamides, polyvinyl ethers, hydroxypropyl cellulose, polyvinyl morpholinone, polymers and copolymers of vinyl sulfonic acid, polyacrylates, polyacrylamides, polyvinyl pyridine and the like. Other suitable polymers include hydrolyzed acrylonitrile grafted starch, acrylic acid grafted starch, and isobutylene maleic anhydride copolymers, and mixtures thereof. Organic high-absorbency materials can include natural materials, such as agar, pectin, guar gum and peat moss. In addition to organic materials, superabsorbent materials may also include inorganic materials, such as absorbent clays and silica gels.

As illustrated by FIGS. 5 and 6, absorbent material 212 may exist in two states: a first, unexpanded state in which the material is capable of absorbing fluid leaked from the LAC module (FIGS. 5A and 5B) and an expanded state in which the material has absorbed fluid leaked from the LAC module (FIGS. 6A and 6B). In some embodiments, absorbent material 212 is configured to absorb a volume of fluid at least as large as the volume of fluid contained in the LAC module (e.g., between 100 and 300 mL). In some embodiments, absorbent material 212 is configured to absorb a volume of fluid at least as large as the length of piping 208 of heat exchanger 206. When in the first, unexpanded state, absorbent material 212 may have a thickness of about 1 mm, e.g., equal to any one of, or between any two of, 0.1 mm, 0.2 mm, 0.3 mm, 0.4 mm, 0.5 mm, 0.6 mm, 0.7 mm, 0.8 mm, 0.9 mm, 1 mm, 1.1 mm, 1.2 mm, 1.3 mm, 1.4 mm, 1.5 mm, 1.6 mm, 1.7 mm, 1.8 mm, 1.9 mm, or 2 mm. When in the second, expanded state, absorbent material 21 may have a thickness of about 5 mm, e.g., equal to any one of, or between any two of, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, or 6 mm. A depth of drip tray 210 may be at least as large as a thickness of the absorbent material in an expanded state after absorbing a volume of fluid corresponding to the amount of fluid contained in the LAC module in the particular absorbent material used. For example, a depth of drip tray 210 may be about 5 mm, e.g., equal to any one of, or between any two of, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, or 6 mm. Reducing the depth of the drip tray 210 to reduce the profile of the information handling system improves the usage of spaces, such as data centers, where information handling system is installed. Thus, a drip tray 210 with depth corresponding to the known fluid volume decreases wasted space, such as when the drip tray 210 is a larger size than needed to accommodate the fluid retention by the particular absorbent material.

In some embodiments, drip tray 210 further comprises a fluid sensor, which may have a controller, such as an embedded controller (EC) or baseboard management controller (BMC) coupled thereto. The controller can be configured to perform steps comprising determining a failure of an electronic component; determining a presence of fluid in the drip tray based on the fluid sensor; and adjusting operation of the same or a different electronic component based on the failure of the electronic component and the presence of fluid. Alternatively, or in addition to these steps, a controller coupled to LAC apparatus can be configured to perform steps comprising determining a failure of a fluid pump of cooling block 204; and adjusting operation of one or more electronic components based on the failure of the fluid pump to reduce heat generation corresponding to fluid flow of the same or a different fluid pump. Operational adjustments can include notifying a user (e.g., sending a text message or other visual and/or auditory alert), decreasing or throttling the frequency of the electronic component(s) (e.g., automatic underclocking, dynamic frequency scaling), decreasing or throttling the voltage delivered to the electronic component(s) (e.g., undervolting, dynamic voltage scaling), disabling non-essential features of the electronic component(s), and/or initiating a safe shut down.

Figure 7:
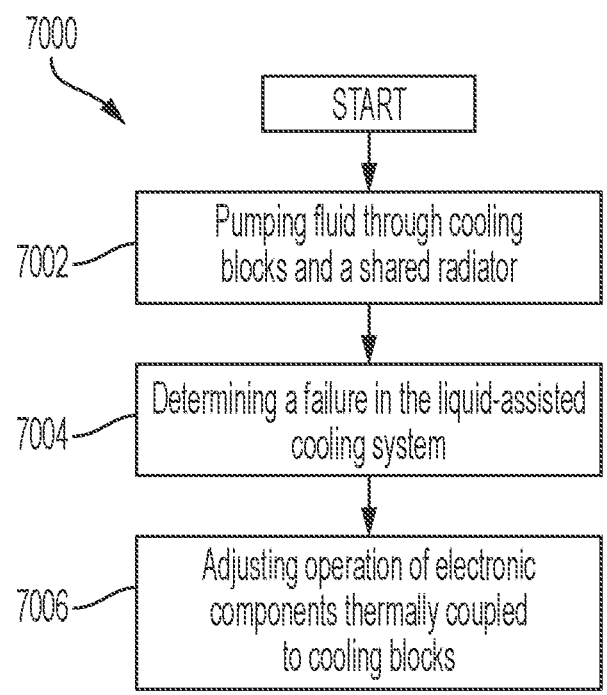
FIG. 7 is a flow chart illustrating a method for adjusting operation of electronic components based on the presence of fluid in a liquid-assisted cooling apparatus according to embodiments of the disclosure.

A method for cooling one or more electronic components is shown in FIG. 7. FIG. 7 is a flow chart illustrating a method for adjusting operation of one or more electronic components of an IHS (e.g., any of those described herein) based on the presence of fluid in a LAC apparatus 200 to ensure appropriate cooling and/or function of the electronic components. To cool the one or more electronic components, a method 7000 may comprise adjusting operation of the one or more electronic components after pumping fluid through a LAC apparatus 200 having a LAC module comprising at least one cooling block 204, a fluid-to-air heat exchanger 206, and piping 208, and a drip tray 210, if fluid is detected in the drip tray.

As described above and as shown at block 7002, fluid may be pumped between one or more cooling block(s) and a heat exchanger, which may be shared by all cooling blocks of the LAC apparatus. For example, fluid may be pumped in serial, parallel or a combination flow pattern of the LAC elements.

At block 7004, the method comprises determining a failure in the liquid-assisted cooling system. One example of such a failure is determining the presence of fluid in the drip tray that is positioned under the shared heat exchanger and configured to collect fluid leaked by or from the LAC module. As described above, the drip tray may include an absorbent material configured to contain fluid leaked by or from the LAC module. The drip tray may also include a liquid sensor for detection of fluid in the drip tray. The presence of fluid in the drip tray may indicate failure or pending failure of an electronic component and/or failure or pending failure of fluid pumps of the cooling blocks due at least in part to fluid leakage from the LAC module into the drip tray. Another example of such a failure is determining that one fluid pump of a cooling block coupled to a shared heat exchanger has failed.

At block 7006, if a failure is determined to have occurred, adjustments are made to the operation of one or more electronic components thermally coupled to the one or more cooling blocks to ensure appropriate cooling and/or operation of the electronic components. The operational adjustments may be made by the controller coupled to the fluid sensor and/or a controller coupled to the LAC apparatus and may reduce heat generation by the electronic component(s). Operational adjustments can include notifying a user (e.g., sending a text message or other visual and/or auditory alert), decreasing or throttling the frequency of the electronic component(s) (e.g., automatic underclocking, dynamic frequency scaling), decreasing or throttling the voltage delivered to the electronic component(s) (e.g., undervolting, dynamic voltage scaling), disabling non-essential features of the electronic component(s), and/or initiating a safe shut down. A safe shut down may include each of the information handling systems sharing liquid through the liquid-assisted cooling system saving all data from volatile memory into non-volatile memory and turning off power, such that a failure in a portion of the liquid-assisted cooling system coupled to one information handling system does not result in loss of data in or damage to other information handling systems.

The invention provides for capture and absorption of leaked fluid. This has an additional benefit of protecting equipment operators from exposure to the fluids. Additionally, the containment limits the transfer of fluid from the originating system into adjacent equipment as would be seen in a data center rack installation.

Figure 8:
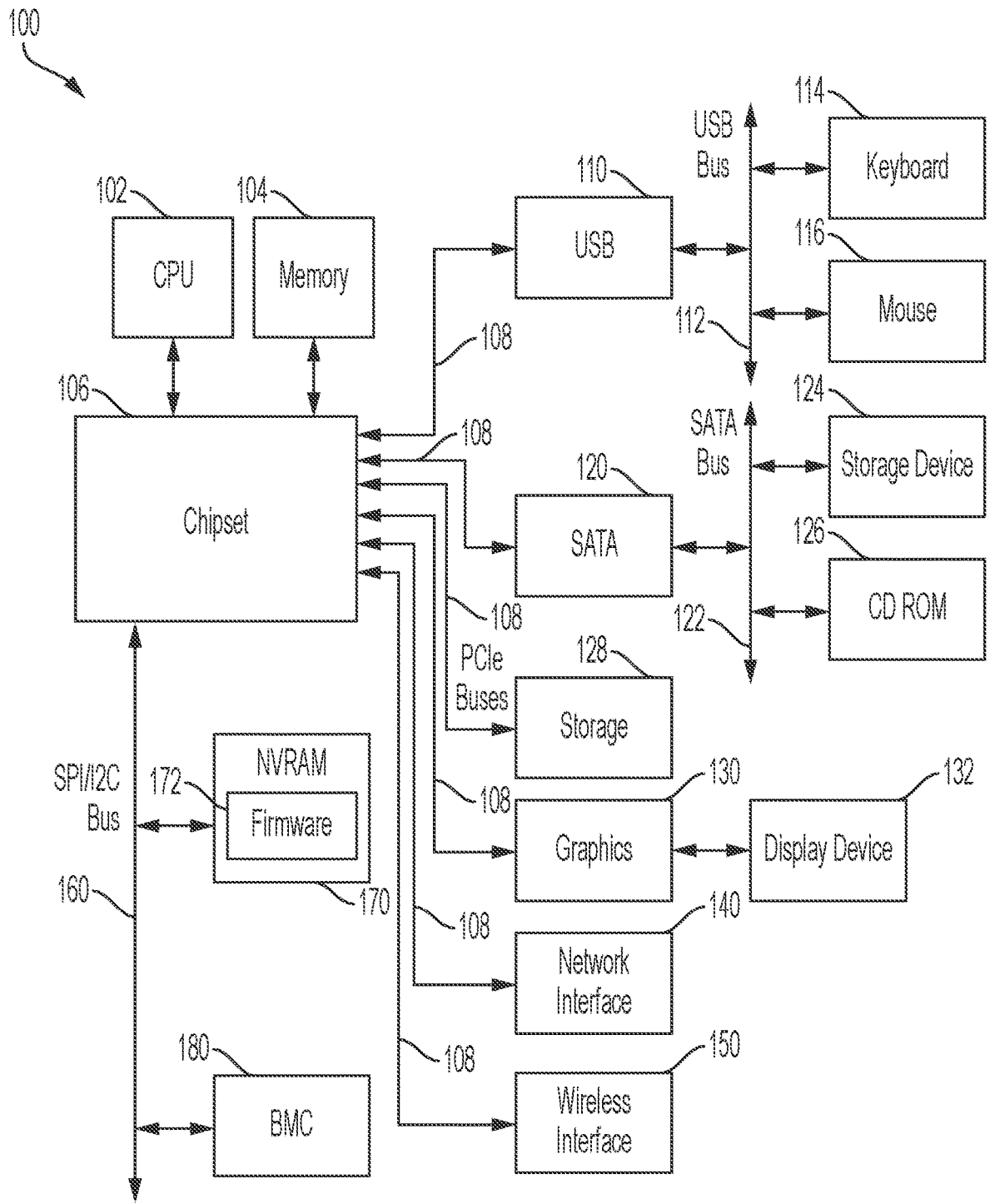
FIG. 8 is a schematic block diagram of an example information handling system according to some embodiments of the disclosure.

These example embodiments describe and illustrate various components and mechanisms for collecting and containing fluid that may be used to cool one or more electronic components of an information handling system, of which one embodiment is illustrated in FIG. 8. In some embodiments, the one or more electronic components may comprise central processing units, primary circuit boards, and the like. In some embodiments, the collection and containment of fluid within an HIS according to the example embodiments disclosed herein may prevent fluid flow between the one or more electronic components.

An information handling system may include a variety of components to generate, process, display, manipulate, transmit, and receive information. One example of an information handling system 100 is shown in FIG. 8. FIG. 8 illustrates an example information handling system 100. Information handling system 100 may include a processor 102 (e.g., a central processing unit (CPU)), a memory (e.g., a dynamic random-access memory (DRAM)) 104, and a chipset 106. In some embodiments, one or more of the processor 102, the memory 104, and the chipset 106 may be included on a motherboard (also referred to as a mainboard), which is a printed circuit board (PCB) with embedded conductors organized as transmission lines between the processor 102, the memory 104, the chipset 106, and/or other components of the information handling system. The components may be coupled to the motherboard through packaging connections such as a pin grid array (PGA), ball grid array (BGA), land grid array (LGA), surface-mount technology, and/or through-hole technology. In some embodiments, one or more of the processor 102, the memory 104, the chipset 106, and/or other components may be organized as a System on Chip (SoC).

The processor 102 may execute program code by accessing instructions loaded into memory 104 from a storage device, executing the instructions to operate on data also loaded into memory 104 from a storage device, and generate output data that is stored back into memory 104 or sent to another component. The processor 102 may include processing cores capable of implementing any of a variety of instruction set architectures (ISAs), such as the x86, POWERPC®, ARM®, SPARC®, or MIPS® ISAs, or any other suitable ISA. In multi-processor systems, each of the processors 102 may commonly, but not necessarily, implement the same ISA. In some embodiments, multiple processors may each have different configurations such as when multiple processors are present in a big-little hybrid configuration with some high-performance processing cores and some high-efficiency processing cores. The chipset 106 may facilitate the transfer of data between the processor 102, the memory 104, and other components. In some embodiments, chipset 106 may include two or more integrated circuits (ICs), such as a northbridge controller coupled to the processor 102, the memory 104, and a southbridge controller, with the southbridge controller coupled to the other components such as USB 110, SATA 120, and PCIe buses 108. The chipset 106 may couple to other components through one or more PCIe buses 108.

Some components may be coupled to one bus line of the PCIe buses 108, whereas some components may be coupled to more than one bus line of the PCIe buses 108. One example component is a universal serial bus (USB) controller 110, which interfaces the chipset 106 to a USB bus 112. A USB bus 112 may couple input/output components such as a keyboard 114 and a mouse 116, but also other components such as USB flash drives, or another information handling system. Another example component is a SATA bus controller 120, which couples the chipset 106 to a SATA bus 122. The SATA bus 122 may facilitate efficient transfer of data between the chipset 106 and components coupled to the chipset 106 and a storage device 124 (e.g., a hard disk drive (HDD) or solid-state disk drive (SDD)) and/or a compact disc read-only memory (CD-ROM) 126. The PCIe bus 108 may also couple the chipset 106 directly to a storage device 128 (e.g., a solid-state disk drive (SDD)). A further example of an example component is a graphics device 130 (e.g., a graphics processing unit (GPU)) for generating output to a display device 132, a network interface controller (NIC) 140, and/or a wireless interface 150 (e.g., a wireless local area network (WLAN) or wireless wide area network (WWAN) device) such as a Wi-Fi® network interface, a Bluetooth® network interface, a GSM® network interface, a 3G network interface, a 4G LTE® network interface, and/or a 5G NR network interface (including sub-6 GHz and/or mmWave interfaces). In one example embodiment, chipset 106 may be directly connected to an individual end point via a PCIe root port within the chipset and a point-to-point topology as shown in FIG. 8.

The chipset 106 may also be coupled to a serial peripheral interface (SPI) and/or Inter-Integrated Circuit (I2C) bus 160, which couples the chipset 106 to system management components. For example, a non-volatile random-access memory (NVRAM) 170 for storing firmware 172 may be coupled to the bus 160. As another example, a controller, such as a baseboard management controller (BMC) 180, may be coupled to the chipset 106 through the bus 160. BMC 180 may be referred to as a service processor or embedded controller (EC). Capabilities and functions provided by BMC 180 may vary considerably based on the type of information handling system. For example, the term baseboard management system may be used to describe an embedded processor included at a server, while an embedded controller may be found in a consumer-level device. As disclosed herein, BMC 180 represents a processing device different from processor 102, which provides various management functions for information handling system 100. For example, an embedded controller may be responsible for power management, cooling management, and the like. An embedded controller included at a data storage system may be referred to as a storage enclosure processor or a chassis processor.

System 100 may include additional processors that are configured to provide localized or specific control functions, such as a battery management controller. Bus 160 can include one or more busses, including a Serial Peripheral Interface (SPI) bus, an Inter-Integrated Circuit (I2C) bus, a system management bus (SMBUS), a power management bus (PMBUS), or the like. BMC 180 may be configured to provide out-of-band access to devices at information handling system 100. Out-of-band access in the context of the bus 160 may refer to operations performed prior to execution of firmware 172 by processor 102 to initialize operation of system 100.

Firmware 172 may include instructions executable by processor 102 to initialize and test the hardware components of system 100. For example, the instructions may cause the processor 102 to execute a power-on self-test (POST). The instructions may further cause the processor 102 to load a boot loader or an operating system (OS) from a mass storage device. Firmware 172 additionally may provide an abstraction layer for the hardware, such as a consistent way for application programs and operating systems to interact with the keyboard, display, and other input/output devices. When power is first applied to information handling system 100, the system may begin a sequence of initialization procedures, such as a boot procedure or a secure boot procedure. During the initialization sequence, also referred to as a boot sequence, components of system 100 may be configured and enabled for operation and device drivers may be installed. Device drivers may provide an interface through which other components of the system 100 can communicate with a corresponding device. The firmware 172 may include a basic input-output system (BIOS) and/or include a unified extensible firmware interface (UEFI). Firmware 172 may also include one or more firmware modules of the information handling system. Additionally, configuration settings for the firmware 172 and firmware of the information handling system 100 may be stored in the NVRAM 170. NVRAM 170 may, for example, be a non-volatile firmware memory of the information handling system 100 and may store a firmware memory map namespace 100 of the information handling system. NVRAM 170 may further store one or more container-specific firmware memory map namespaces for one or more containers concurrently executed by the information handling system.

Information handling system 100 may include additional components and additional busses, not shown for clarity. For example, system 100 may include multiple processor cores (either within processor 102 or separately coupled to the chipset 106 or through the PCIe buses 108), audio devices (such as may be coupled to the chipset 106 through one of the PCIe busses 108), or the like. While a particular arrangement of bus technologies and interconnections is illustrated for the purpose of example, one of skill will appreciate that the techniques disclosed herein are applicable to other system architectures. System 100 may include multiple processors and/or redundant bus controllers. In some embodiments, one or more components may be integrated together in an integrated circuit (IC), which is circuitry built on a common substrate. For example, portions of chipset 106 can be integrated within processor 102. Additional components of information handling system 100 may include one or more storage devices that may store machine-executable code, one or more communications ports for communicating with external devices, and various input and output (I/O) devices, such as a keyboard, a mouse, and a video display.

In some embodiments, processor 102 may include multiple processors, such as multiple processing cores for parallel processing by the information handling system 100. For example, the information handling system 100 may include a server comprising multiple processors for parallel processing. In some embodiments, the information handling system 100 may support virtual machine (VM) operation, with multiple virtualized instances of one or more operating systems executed in parallel by the information handling system 100. For example, resources, such as processors or processing cores of the information handling system may be assigned to multiple containerized instances of one or more operating systems of the information handling system 100 executed in parallel. A container may, for example, be a virtual machine executed by the information handling system 100 for execution of an instance of an operating system by the information handling system 100. Thus, for example, multiple users may remotely connect to the information handling system 100, such as in a cloud computing configuration, to utilize resources of the information handling system 100, such as memory, processors, and other hardware, firmware, and software capabilities of the information handling system 100. Parallel execution of multiple containers by the information handling system 100 may allow the information handling system 100 to execute tasks for multiple users in parallel secure virtual environments.

The schematic flow chart diagram of FIG. 7 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software and/or firmware.

If implemented in firmware and/or software, operational adjustment functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data related to the operational adjustment functions may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
    a first cooling block for a first electronic component comprising a first fluid cavity;
    a heat exchanger comprising piping, the piping coupled to the first fluid cavity of the first cooling block;
    a drip tray positioned under the heat exchanger and extending at least to the edges of the piping; and
    an absorbent material in the drip tray configured to absorb a volume of fluid at least as large as the length of piping of the heat exchanger, and wherein the drip tray comprises a depth at least as large as a thickness of the absorbent material after absorbing the volume of fluid.

2. The apparatus of claim 1, wherein the first cooling block comprises a first fluid pump coupled to the first fluid cavity.

3. The apparatus of claim 1, wherein the piping of the heat exchanger is coupled to the first cooling block through a piping connector, and wherein the drip tray comprises at least one protrusion extending beyond the heat exchanger and under the piping connector.

4. The apparatus of claim 1, wherein the absorbent material comprises compressed plant fiber.

5. The apparatus of claim 1, wherein the absorbent material comprises super absorbent polymer (SAP).

6. The apparatus of claim 1, further comprising the first electronic component, wherein the first cooling block is thermally coupled to the first electronic component, the apparatus further comprising:
    a second electronic component; and
    a second cooling block comprising a second fluid cavity, wherein the second cooling block is thermally coupled to the second electronic component,
    wherein the piping of the heat exchanger is coupled to the second fluid cavity of the second cooling block.

7. The apparatus of claim 6, further comprising:
    a fluid sensor in the drip tray;
    a controller coupled to the fluid sensor, wherein the controller is configured to perform steps comprising:
        determining a failure of the first electronic component;
        determining a presence of fluid in the drip tray based on the fluid sensor; and
        adjusting operation of the second electronic component based on the failure of the first electronic component and the presence of fluid.

8. The apparatus of claim 6, further comprising:
    a second fluid pump coupled to the second fluid cavity; and
    a controller, wherein the controller is configured to perform steps comprising:
        determining a failure of the first fluid pump; and
        adjusting operation of the first electronic component and the second electronic component corresponding to fluid flow of the second fluid pump based on the failure of the first fluid pump to reduce heat generation.

9. An information handling system, comprising:
    a memory;
    a first processor for a first electronic component coupled to the memory;
    a second processor for a second electronic component coupled to the memory;
    a first cooling block thermally coupled to a first fluid pump and the first processor comprising a first fluid cavity;

a second cooling block thermally coupled to a second fluid pump and the second processor comprising a second fluid cavity;

a heat exchanger comprising piping, the piping coupled to the first fluid cavity of the first cooling block and the second fluid cavity of the second cooling block;

a drip tray positioned under the heat exchanger and extending at least to the edges of the piping; and a controller coupled to the first processor and to the second processor, wherein the controller is configured to perform steps comprising:
  determining a failure of the first fluid pump; and
  adjusting operation of the first electronic component and the second electronic component based on the failure of the first fluid pump corresponding to fluid flow of the second fluid pump to reduce heat generation.

10. The information handling system of claim 9, further comprising:
a fluid sensor in the drip tray; and
a controller coupled to the first processor and to the second processor, wherein the controller is configured to perform steps comprising:
  determining a failure of the first processor;
  determining a presence of fluid in the drip tray based on the fluid sensor; and
  adjusting operation of the second processor based on the failure of the first electronic component and the presence of fluid.

11. The information handling system of claim 9, wherein the first cooling block comprises a first fluid pump coupled to the first fluid cavity.

12. The information handling system of claim 9, wherein the piping of the heat exchanger is coupled to the first cooling block through a piping connector, and wherein the drip tray comprises at least one protrusion extending beyond the heat exchanger and under the piping connector.

13. The information handling system of claim 9, further comprising an absorbent material in the drip tray.

14. The information handling system of claim 13, wherein the absorbent material comprises compressed plant fiber or a SAP.

15. A method, comprising:
pumping fluid through a first cooling block and a shared heat exchanger with a first pump;
pumping fluid through a second cooling block and the shared heat exchanger with a second pump;
determining, based on a failure of the first pump, a failure in the liquid-assisted cooling system; and
adjusting operation of a first electronic component thermally coupled to the first cooling block and a second electronic component thermally coupled to the second cooling block based on determining the presence of fluid in the drip tray, the operation corresponding to fluid flow of the second fluid pump based on the failure of the first fluid pump.

16. The method of claim 15, wherein determining a failure in the liquid-assisted cooling system comprises determining a presence of fluid in a drip tray under the shared heat exchanger, the method further comprising:
adjusting operation of the second electronic component based on the failure of the first electronic component and the presence of fluid.

* * * * *